United States Patent
Chen et al.

(10) Patent No.: US 11,615,946 B2
(45) Date of Patent: Mar. 28, 2023

(54) BAFFLE PLATE FOR CONTROLLING WAFER UNIFORMITY AND METHODS FOR MAKING THE SAME

(71) Applicant: Taiwan Semiconductor Manufacturing Co., Ltd., Hsinchu (TW)

(72) Inventors: Jr-Sheng Chen, Hsinchu (TW); An-Chi Li, Hsin-Chu (TW); Shih-Che Huang, Zhubei (TW); Chih-Hsien Hsu, Hsinchu (TW); Zhi-Hao Huang, Hsin-Chu (TW); Alex Wang, Hsin-Chu (TW); Yu-Pei Chiang, Hsinchu (TW); Chun Yan Chen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 262 days.

(21) Appl. No.: 16/422,071

(22) Filed: May 24, 2019

(65) Prior Publication Data
US 2020/0075294 A1 Mar. 5, 2020

Related U.S. Application Data

(60) Provisional application No. 62/712,673, filed on Jul. 31, 2018.

(51) Int. Cl.
C23C 16/00 (2006.01)
H01L 21/306 (2006.01)
(Continued)

(52) U.S. Cl.
CPC .... *H01J 37/32633* (2013.01); *H01J 37/3244* (2013.01); *H01L 21/67069* (2013.01);
(Continued)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32633; H01J 37/3244; H01J 37/32623; H01J 37/32642; H01J 37/32651
See application file for complete search history.

(56) References Cited

U.S. PATENT DOCUMENTS 6,162,323 A * 12/2000 Koshimizu ......... H01J 37/3244
156/345.26
6,167,836 B1 * 1/2001 Taguwa ............ H01J 37/32495
118/723 E
(Continued)

*Primary Examiner* — Luz L Alejandro Mulero
(74) *Attorney, Agent, or Firm* — Duane Morris LLP

(57) ABSTRACT

Devices and methods for controlling wafer uniformity using a gas baffle plate are disclosed. In one example, a device for plasma-based processes is disclosed. The device includes: a housing defining a process chamber and a baffle plate arranged above a wafer in the process chamber. The baffle plate is configured to control plasma distribution on the wafer. The baffle plate has a shape of an annulus that comprises a first annulus sector and a second annulus sector. The first annulus sector has a first inner radius. The second annulus sector has a second inner radius that is different from the first inner radius.

20 Claims, 10 Drawing Sheets

(51) Int. Cl.
  *H01J 37/32*    (2006.01)
  *H01L 21/67*    (2006.01)
  *H01L 21/768*   (2006.01)

(52) U.S. Cl.
  CPC ............... *H01J 2237/3341* (2013.01); *H01J 2237/3347* (2013.01); *H01L 21/76898* (2013.01)

(56) References Cited

U.S. PATENT DOCUMENTS

| | | | |
|---|---|---|---|
| 2010/0081284 A1* | 4/2010 | Balakrishna | H01J 37/3244 118/728 |
| 2010/0196625 A1* | 8/2010 | Yoon | H01J 37/32422 427/569 |
| 2013/0102155 A1* | 4/2013 | Gang | H01J 37/321 438/710 |
| 2015/0136734 A1* | 5/2015 | Chae | H01J 37/32357 156/345.33 |
| 2018/0047595 A1* | 2/2018 | Kofuji | H01L 21/67069 |
| 2018/0061681 A1* | 3/2018 | Koshimizu | H01L 21/67103 |
| 2019/0035610 A1* | 1/2019 | Yeom | H01J 37/32357 |

* cited by examiner

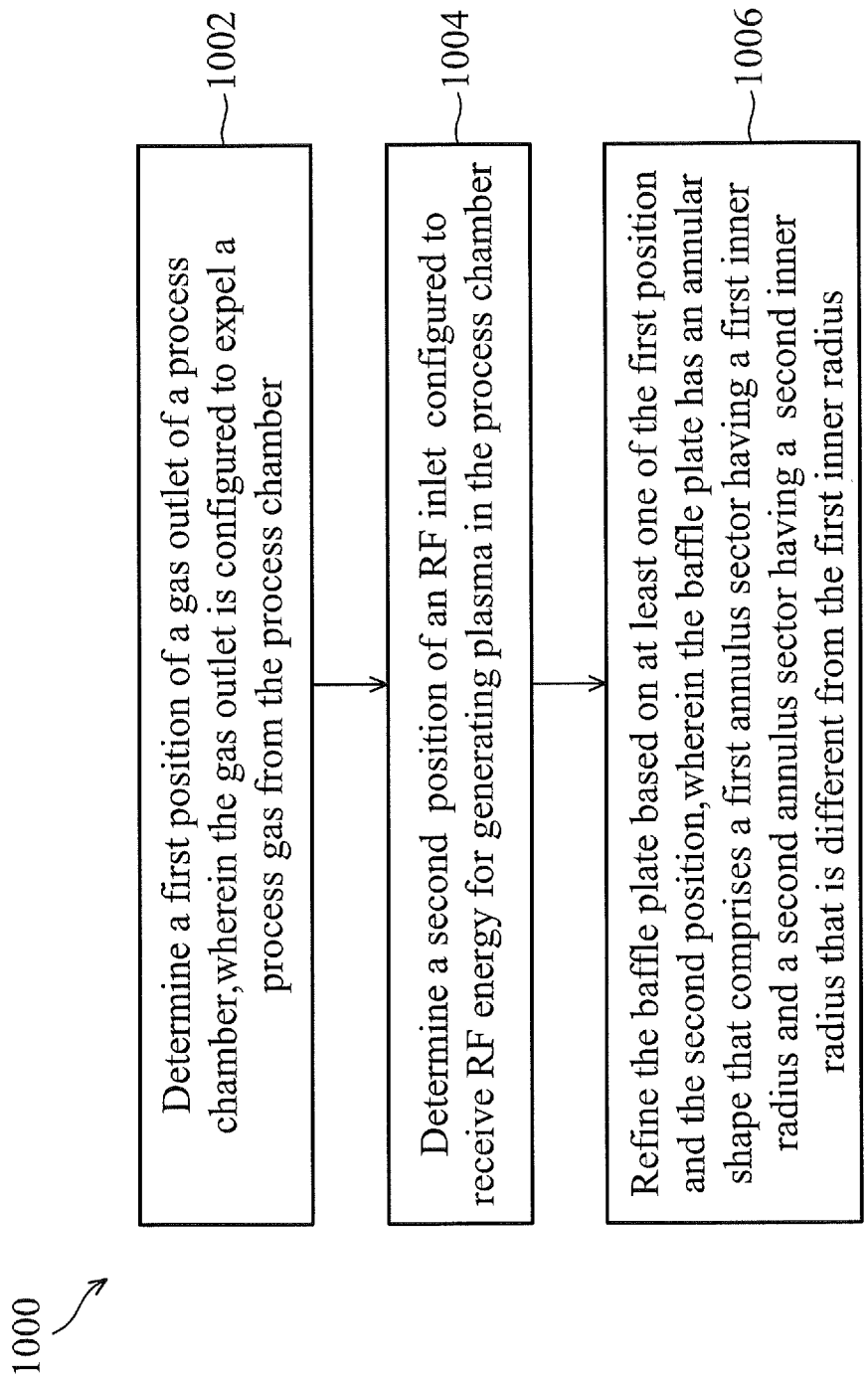

BAFFLE PLATE FOR CONTROLLING WAFER UNIFORMITY AND METHODS FOR MAKING THE SAME

CROSS-REFERENCE TO RELATED APPLICATION

The present application claims priority to U.S. Provisional Patent Application No. 62/712,673 filed on Jul. 31, 2018, which is incorporated by reference herein in its entirety.

BACKGROUND

Plasma based processing techniques have gained widespread use in fabrication of devices for various applications, such as semiconductor integrated devices, microelectronic devices, and microelectromechanical devices. When patterning techniques such as photolithography, deposition, and etching are used to form various features on a wafer in a semiconductor process chamber, an important goal is to have uniform critical dimensions (CD) of the patterned features within the wafer.

A key factor for wafer uniformity during a plasma based process, e.g. etching, deposition, or polishing, is the plasma distribution on the wafer surface. A wafer process chamber may include a gas baffle plate, a gas inlet, a gas outlet, and a radio frequency (RF) inlet. Each of these components can impact the plasma distribution in the wafer process chamber, thus impacting the CD uniformity of the wafer as well. An existing design of gas baffle plate is isotropic, i.e. treating all orientations on the plate surface to be the same, and has an inner diameter independent of the layouts of the gas inlet, the gas outlet, and the RF inlet, which cannot satisfy a uniformity requirement, especially in through-silicon via (TSV) and deep silicon etching processes which have a high standard of etching uniformity.

Therefore, existing devices and methods for controlling wafer uniformity in plasma-based processes are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIG. 10 is a flow chart illustrating an exemplary method for designing a gas baffle plate to control wafer uniformity in plasma-based process, in accordance with some embodiments of the present disclosure.

DETAILED DESCRIPTION OF EXEMPLARY EMBODIMENTS

Figure 1:
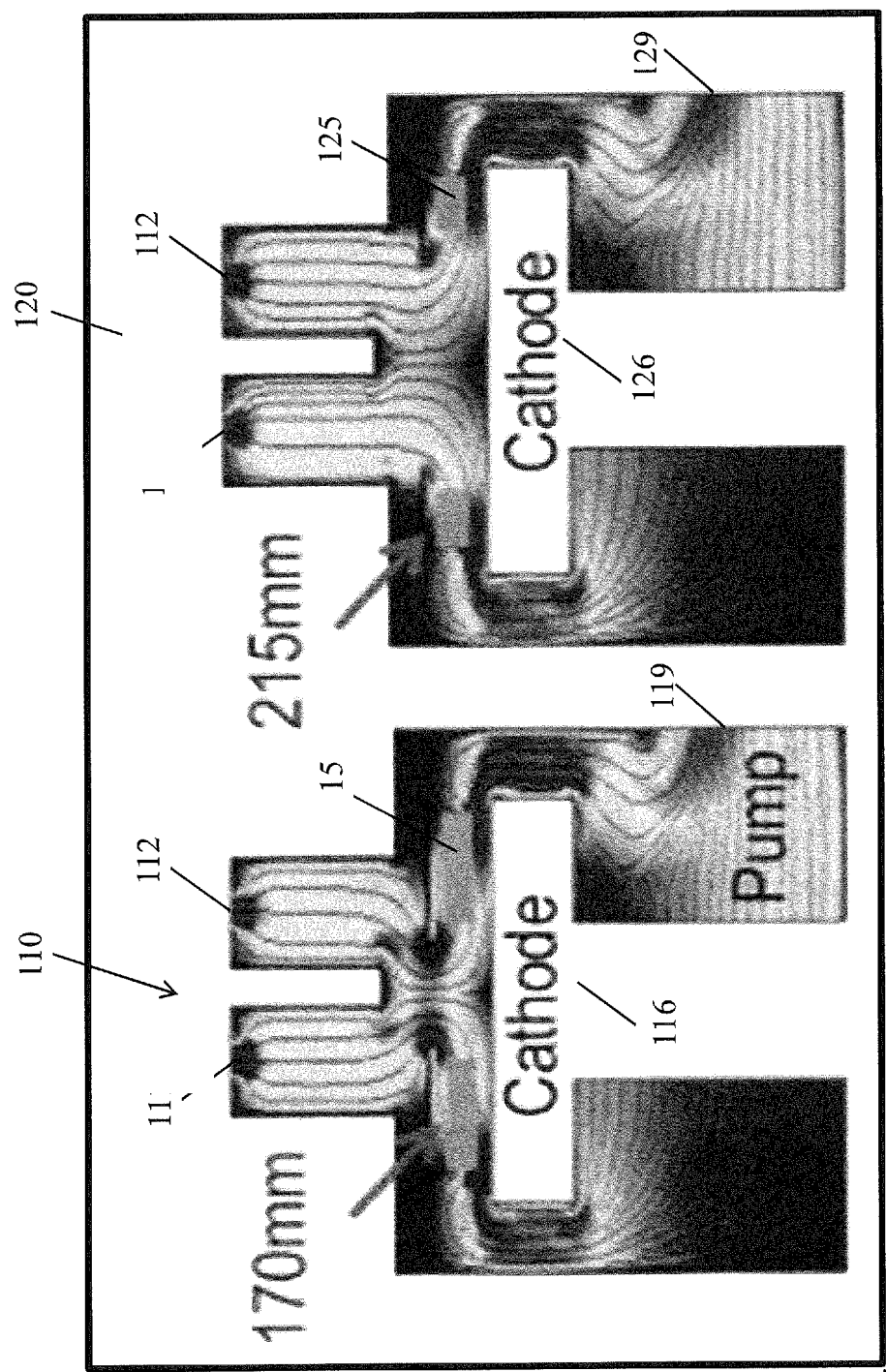
FIG. 1 illustrates exemplary plasma flow field distributions in a cross-sectional view of a process chamber, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Wafer uniformity control is a tough task for all stages in plasma based processing. For example, critical dimension (CD) performance in deep silicon etching process is hard to control but is critical to final wafer testing, e.g. wafer acceptance test (WAT) or circuit probe (Cp), which can easily suffer a loop edge or a low yield. A gas baffle plate may be arranged above a wafer in a process chamber and configured to control plasma distribution on the wafer. The gas baffle plate has an inner diameter whose size can impact plasma flow field distribution on the wafer. Varying the size of the gas baffle plate can change the plasma flow field distribution, which may improve plasma uniformity and hence etching uniformity.

However, due to the same inner radius along all directions of an existing gas baffle, the gas baffle does not compensate for non-uniformities in the plasma and etching caused by a layout of the process chamber. The layout may be defined by, for example, an arrangement of gas inlets, gas outlets, radio frequency (RF) inlet electrode, or a combination of the foregoing. As such, existing design of gas baffle is not enough for controlling etching uniformity. For example, etching uniformity is highly desired for notching window of a high-density deep-depth and low-pitch via, e.g. used to gain scan-through efficiency of optical sensing in an under-display fingerprint recognition component of a portable device. In one example, while silicon etching uniformity needs to be less than 10% for a through-silicon via (TSV) with a depth/width aspect ratio larger than 15 and a pitch less than 8 micrometers, a process tool with an existing design of gas baffle can merely achieve an etching uniformity of 23.3%.

The present application is directed towards process devices and methods for achieving a high uniformity in plasma-based etching with a newly designed gas baffle. In some embodiments, the gas baffle has a shape of an annulus that comprises a first annulus sector having a first inner radius and a second annulus sector having a second inner radius. The first inner radius is different from the second inner radius. The values of first inner radius and the second inner radius may be designed based on at least one of positions of the gas inlet, the gas outlet and the RF inlet. That is, the inner radius (or diameter) of the gas baffle plate is not the same along all directions, but are designed differently in different zones of the gas baffle plate based on a layout of the gas inlet, the gas outlet, and/or the RF inlet of the process chamber where the gas baffle plate is arranged.

In one embodiment, the first annulus sector comprises a first point that is farthest away from the RF inlet among all points on the baffle plate; and the second annulus sector comprises a second point that is centrosymmetric to the first point around a center point of the baffle plate. In this case, the first inner radius is designed to be larger than the second inner radius to move the gas flow away from the RF inlet side of the wafer to the opposite side of the RF inlet of the wafer. This compensates for the wafer non-uniformity induced by the layout and position of the RF inlet in the process chamber.

In another embodiment, the first annulus sector comprises a first point that is farthest away from the gas outlet among all points on the baffle plate; and the second annulus sector comprises a second point that is centrosymmetric to the first point around a center point of the baffle plate. In this case, the first inner radius is designed to be larger than the second inner radius to move the gas flow away from the gas outlet side of the wafer to the opposite side of the gas outlet of the wafer. This compensates for the wafer non-uniformity induced by the layout and position of the gas outlet in the process chamber.

The present disclosure is applicable to wafer uniformity control during any wafer processing using a gas baffle. The disclosed gas baffle can improve etching uniformity to meet uniformity standards during bulk manufacture of TSV and deep silicon etching processes. In the present disclosure, the terms "gas baffle", "gas baffle plate", and "baffle plate" may be used interchangeably.

FIG. 1 illustrates exemplary plasma flow field distributions 110, 120 in a cross-sectional view of a process chamber, in accordance with some embodiments of the present disclosure. The plasma flow field distribution 110 is for a process chamber with a gas baffle plate 115 having an inner diameter of 170 mm. As in the cross-sectional view of the process chamber shown in FIG. 1, the gas baffle plate 115 has an annular shape with a center hole. The process chamber has a cathode support 116 for a wafer (not shown) to be processed. The wafer will be placed on the cathode support 116 and under the gas baffle plate 115. During processing, the plasma gas flows from the inlets 111, 112, which may be holes of a GDP, into the process chamber, goes through the center hole of the gas baffle plate 115 onto the wafer, and is pumped out of the process chamber through the gas outlet 119. A gas baffle may be employed with any plasma-based process in which uniform plasma is desired, e.g. plasma-based etching, plasma activation, etc. For simplicity, plasma-based etching will be used as an example in the following description about wafer uniformity improvement.

The plasma flow field distribution 120 is for a process chamber with a gas baffle plate 125 having an inner diameter of 215 mm. As in the cross-sectional view of the process chamber shown in FIG. 1, the gas baffle plate 125 has an annular shape with a center hole. The process chamber has a cathode support 126 for a wafer (not shown) to be processed. The wafer will be placed on the cathode support 126 and under the gas baffle plate 125. During processing, the plasma gas flows from the inlets 121, 122, which may be holes of a GDP, into the process chamber, goes through the center hole of the gas baffle plate 125 onto the wafer, and is pumped out of the process chamber through the gas outlet 129.

As shown in FIG. 1, the gas baffle plate 115 having a smaller inner diameter of 170 mm makes the plasma flow field more focused at the inner side of the wafer; while the gas baffle plate 125 having a larger inner diameter of 215 mm enables the plasma flow field more extended to the outer side of the wafer. A larger inner diameter of a gas baffle may improve wafer etching rate uniformity, but a too large inner diameter of a gas baffle may make the average etching rate of the wafer to be low. While the inner diameter size of an existing gas baffle is merely based on a customer design requirement for the semiconductor wafer, the disclosed gas baffle has an inner diameter size designed based on positions of the gas inlet, the gas outlet, and/or the RF inlet of the process chamber as well.

Figure 2:
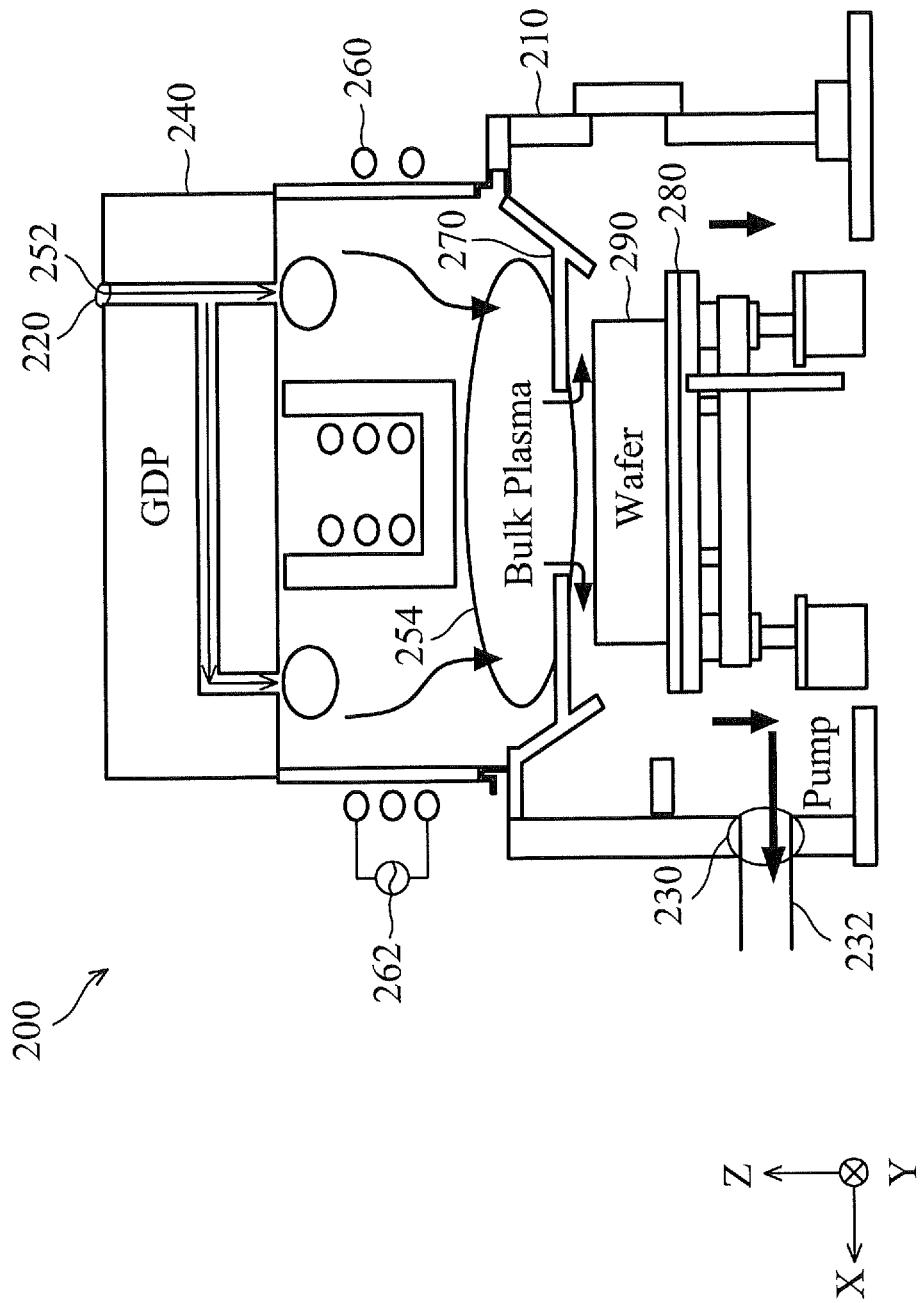
FIG. 2 illustrates a cross-sectional view of an exemplary plasma-based process tool with a gas baffle plate, in accordance with some embodiments of the present disclosure.

FIG. 2 illustrates a cross-sectional view of an exemplary plasma-based process tool 200 with a gas baffle plate 270, in accordance with some embodiments of the present disclosure. The process tool 200 may be configured to perform plasma-based etching, such as, for example, deep reactive ion etching (DRIE) or plasma etching. In some embodiments, the process tool 200 is configured to perform a Bosch process. As shown in FIG. 2, the processing tool 200 includes a housing 210 defining a process chamber, and a GDP 240 arranged in the process chamber 210. The housing 210 comprises a gas inlet 220 configured to receive a process gas 252, and a gas outlet 230 configured to expel the processed gas. The GDP 240 is configured to distribute the process gas 252 within the process chamber 210.

In one embodiment, the GDP 240 has a plurality of holes evenly distributed thereon. The term "even" or "evenly" herein may refer to a uniform distribution of the holes with a constant density in a given area. After the GDP 240 receives the process gas 252 from the gas inlet 220, the process gas 252 enters the process chamber 210 through the holes on the GDP 240. The process gas 252 may include, for example, sulfur hexafluoride ($SF_6$) and/or octofluorocyclobutane ($C_4F_8$). As such, the GDP 240 distributes the process gas 252 received from the gas inlet 220 into the process chamber 210 through holes of the GDP 240.

The GDP 240 is located on top of an upper region of the process chamber 210 that is on top of a lower region of the process chamber 210 along the Z direction. The lower region of the process chamber 210 accommodates a wafer support 280 and is connected to a pumping line 232 through a gas outlet 230 of the housing. The wafer support 280 is configured to support a wafer 290 and, in some embodiments, is or otherwise comprises an electrode. The wafer 290 may be, for example, a 350 millimeter or 450 millimeter semiconductor wafer. The electrode may be, for example, electrically coupled to an RF source configured to promote the migration of particles from overlying plasma 254 towards the wafer support 280. In one embodiment, the pumping line 232 is connected to an exhaust pump (not shown in FIG. 2) configured to remove gases 250, 254 from the process chamber 210 and/or to otherwise control a pressure of the process chamber 210 relative to an ambient environment of the process tool 200.

As shown in FIG. 2, the process chamber 210 further comprises a spiral inductor 260 laterally spirals around the upper region of the process chamber and is electrically coupled to an RF source 262. The spiral inductor 260 is configured to receive RF energy from the RF source 262 through an RF inlet (not shown in FIG. 2) and excite the process gases 252 using the RF energy, thereby producing the plasma 254 with a high density in the upper region of the process chamber 210.

A gas baffle 270 having an annular shape is placed above the wafer 290 to adjust the plasma distribution on the wafer 290. In operation, the plasma 254 goes through the hole of the gas baffle 270 and interfaces with the wafer 290 on the wafer support 280 to perform plasma-based etching. For example, the plasma 254 may chemically react with the wafer 290 to remove material from the wafer 290. As another example, chemical reaction of the wafer 290 with the plasma 254 and bombardment of the wafer 290 with particles of the plasma 254 may be employed to remove material from the wafer 290.

The plasma distribution and hence etching rate distribution on the wafer 290 can be controlled by the gas baffle plate 270 through a design of the structure and inner diameters (or inner radii) of the gas baffle plate 270, based on position(s) of the gas inlet 220, the gas outlet 230, and/or the RF inlet of the spiral inductor 260. In this example, the gas outlet 230 is located on the left side, i.e. to the X direction, of the gas baffle plate 270, while the gas inlet 220 is located towards the right side, i.e. towards the −X direction, of the gas baffle plate 270. According to various embodiments, the gas inlet 220 and/or the gas outlet 230 may be located at other locations relative to the gas baffle plate 270. The RF inlet of the spiral inductor 260 is not shown in the cross-sectional view of the process tool 200 in FIG. 2. Since the gas outlet 230 and the pumping line 232 are coupled to each other, a position of the gas outlet 230 corresponds to a position of the pumping line 232. In the following description, a position of a gas outlet will be used to refer to both positions of the gas outlet and the connected pumping line.

Figure 3:
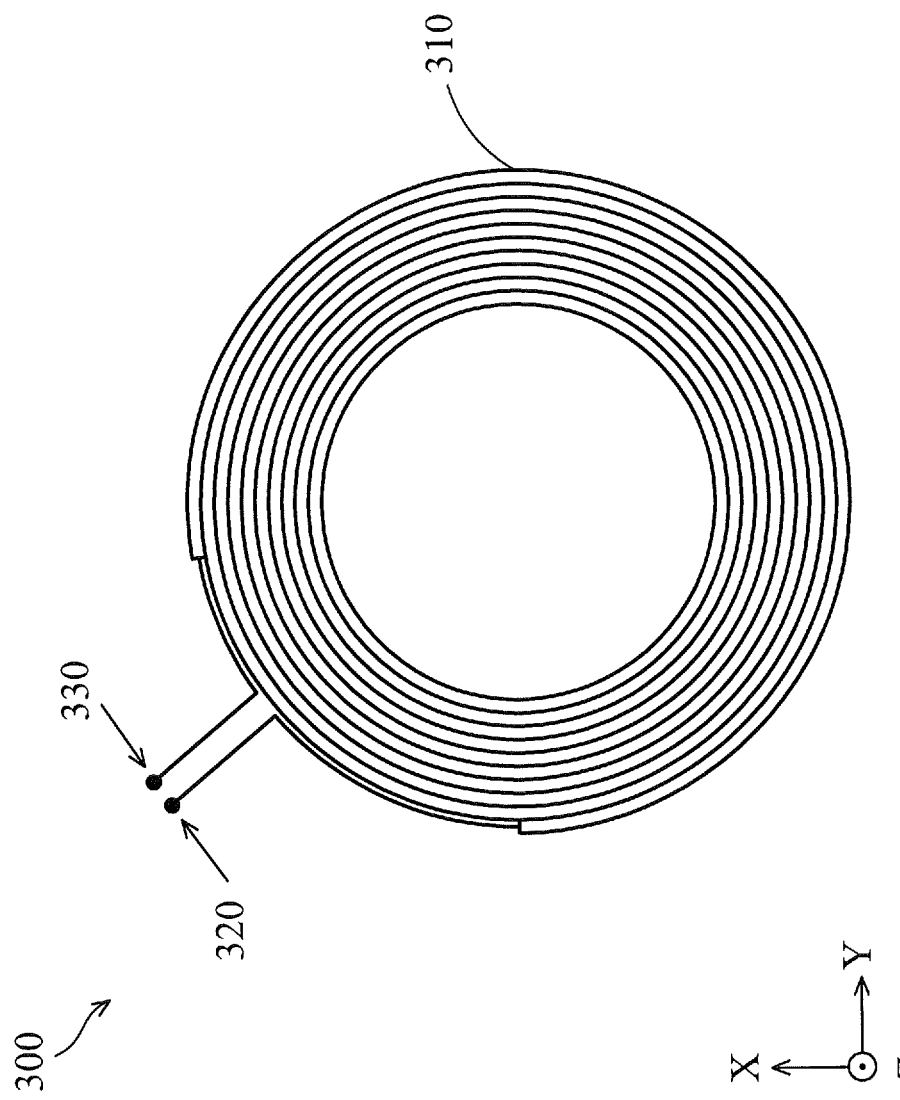
FIG. 3 illustrates an exemplary spiral inductor used in a plasma-based process tool, in accordance with some embodiments of the present disclosure.

FIG. 3 illustrates a top view 300 of an exemplary spiral inductor 310 used in a plasma-based process tool, in accordance with some embodiments of the present disclosure. As shown in FIG. 3, the spiral inductor 310 has a powered end 320 and a grounded end 330. The powered end 320 is coupled to an RF source and serves as an RF inlet to receive RF energy from the RF source. Compared to other portions of the spiral inductor 310, the RF inlet 320 is a portion that has a higher voltage and a higher ionization energy, which induces a stronger magnetic field and higher plasma density at the RF inlet 320. As such, a design of a gas baffle plate above the spiral inductor 310 may take into consideration of the position of the RF inlet 320. In this embodiment, the RF inlet 320 is located at the upper left side, i.e. to a direction between X and −Y, of the spiral inductor 310. The RF inlet 320 may be located at another direction of the spiral inductor 310 according to other embodiments.

Figure 4:
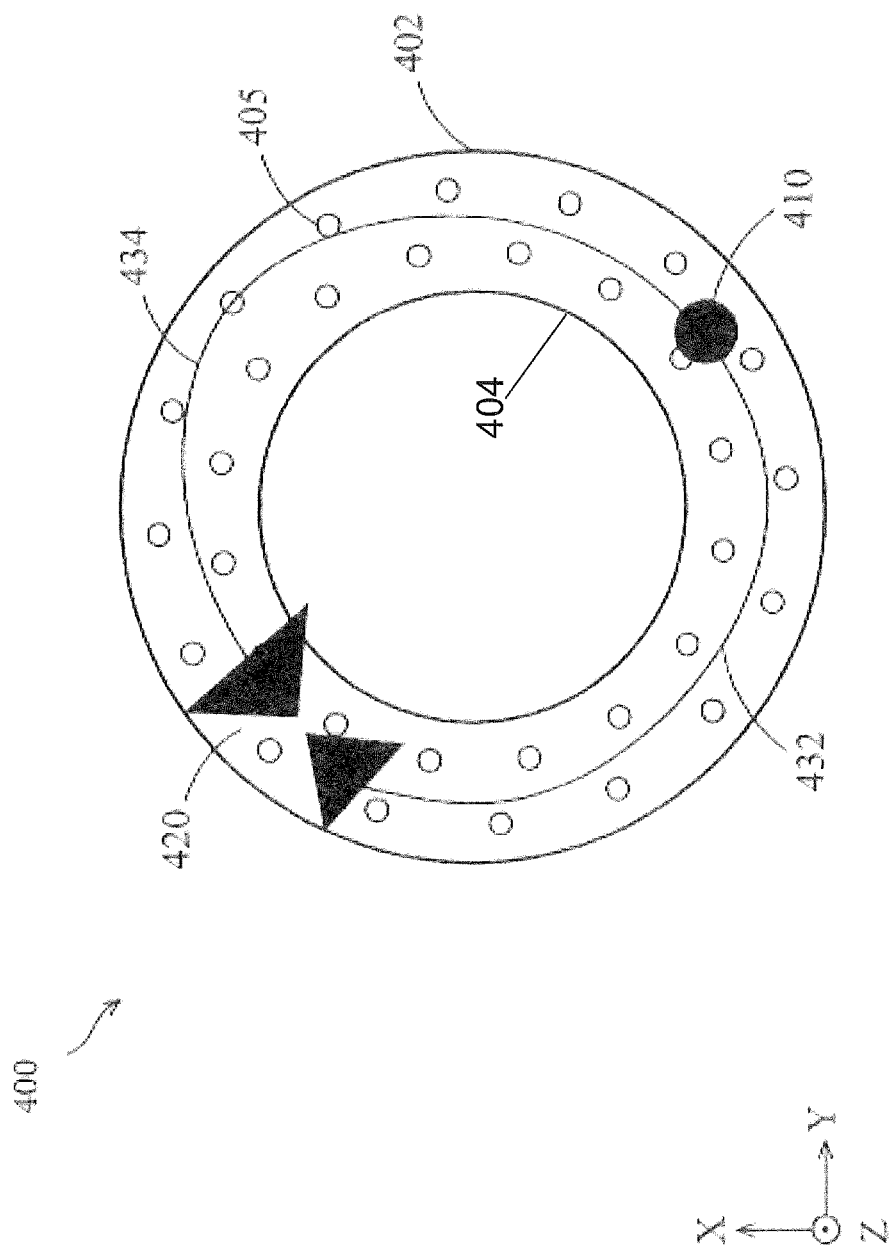
FIG. 4 illustrates a top view of an exemplary gas distribution plate (GDP) with a marked gas inlet position, in accordance with some embodiments of the present disclosure.

FIG. 4 illustrates a top view of an exemplary GDP 400 with a marked gas inlet position, in accordance with some embodiments of the present disclosure. In one embodiment, the GDP 400 may be implemented as the GDP 240 in FIG. 2. As shown in FIG. 4, the GDP 400 in this example has an annular shape bordered by an outer circle 402 and an inner circle 404. The GDP 400 has a plurality of holes 405 evenly distributed thereon. As discussed before, a gas inlet is located above, i.e. to the Z direction of, the GDP 400 to receive process gas. FIG. 4 shows a projection area 410 of the gas inlet onto the GDP 400. The projection area 410 is a GDP portion having a shortest distance to the gas inlet and serves as a process gas source for the GDP 400, and is referred to as the gas inlet area 410. That is, the process gas received by the gas inlet first arrives at the gas inlet area 410 of the GDP 400, and then goes into the process chamber through the holes 405.

As shown in FIG. 4, the process gas may move along two paths 432, 434 into the process chamber. The path 432 extends from the gas inlet area 410 to the left side (along the −Y direction) and then to the upper side (along the X direction) of the gas inlet area 410. The path 434 extends from the gas inlet area 410 to the right side (along the Y direction) and then to the upper side (along the X direction) of the gas inlet area 410. In the example of FIG. 4, a first wafer portion under the gas inlet area 410 would interface with a higher density of process gas, e.g. $C_4F_8$, than the gas density at a second wafer portion under the area 420 which is farthest away from the gas inlet area 410 on the GDP 400, which would decrease the etching rate at the first wafer portion and increase the etching rate at the second wafer portion. As such, position of the gas inlet area 410 can impact the wafer uniformity as well.

Figure 5:
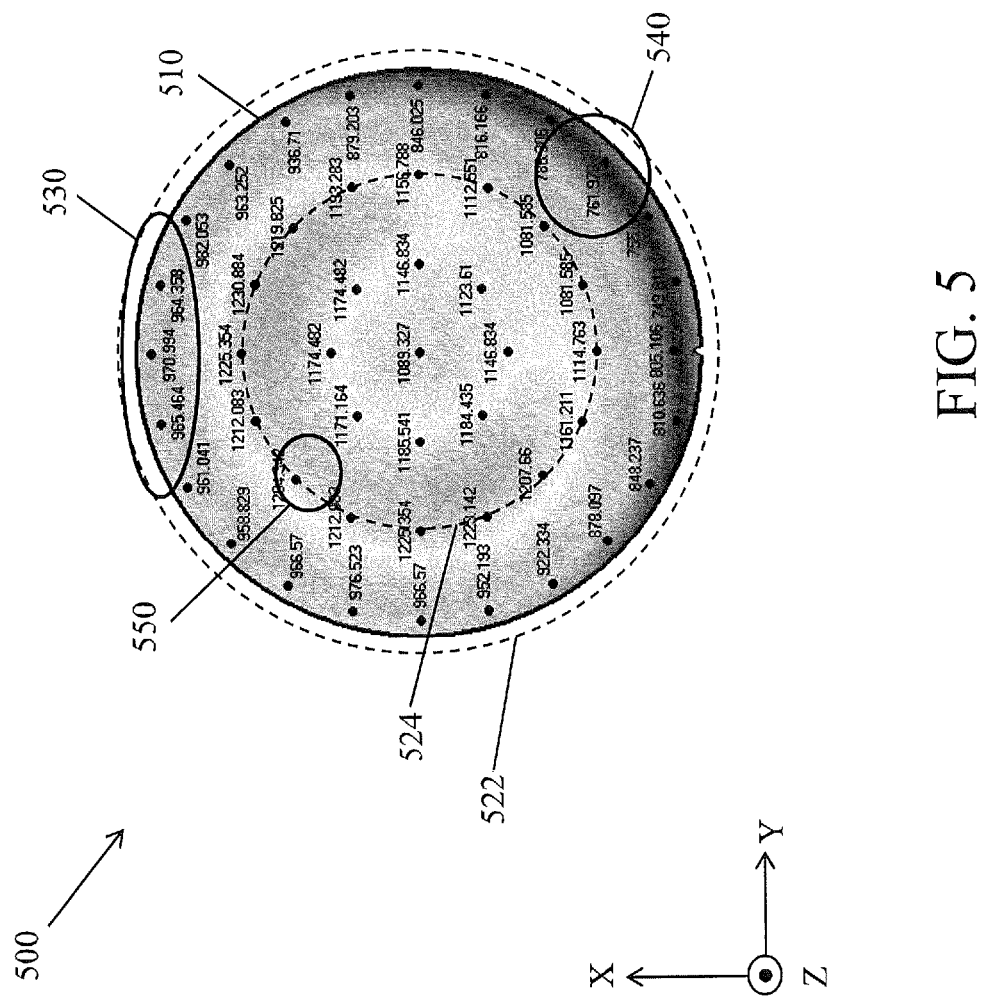
FIG. 5 illustrates an exemplary critical dimension (CD) map of a wafer, in accordance with some embodiments of the present disclosure.

FIG. 5 illustrates an exemplary critical dimension (CD) map 500 of a wafer 510, in accordance with some embodiments of the present disclosure. As shown in FIG. 5, the CD map 500 shows a distribution of CD performance, e.g. bulk chemical distribution (BCD), on the wafer 510. Based on a top view of the wafer 510, FIG. 5 shows a corresponding projection of the gas baffle plate placed above the wafer 510, where the gas baffle plate has an annular shape bordered by an outer circle 522 and an inner circle 524. In addition, FIG. 5 also shows wafer portions of the wafer 510 corresponding to the gas inlet, the gas outlet, and the RF inlet. The grey scale shown in FIG. 5 reflects critical dimensions.

In this example, a wafer portion 540 corresponds to the gas inlet. That is, the wafer portion 540 is closer to the gas inlet than any other portion of the wafer 510, and is referred to as the gas inlet portion 540. In this example, the gas inlet portion 540 is located at the right lower corner, to a direction between Y and −X, of the wafer 510. As discussed before, due to a higher process gas density at the gas inlet portion 540, the gas inlet portion 540 tends to have a lower etching rate than other wafer portions. As such, with a gas baffle plate having a same diameter along all directions of the plate surface, the BCD performance of a point on the wafer 510 tends to become lower as the point moves closer to the gas inlet portion 540.

In this example, a wafer portion 550 corresponds to the RF inlet. That is, the wafer portion 550 is closer to the RF inlet than any other portion of the wafer 510, and is referred to as the RF inlet portion 550. In this example, the RF inlet portion 550 is located at the left upper portion, to a direction between X and −Y, of the wafer 510. As discussed before, due to a stronger magnetic field and a higher plasma density at the wafer portion 550, the RF inlet portion 550 tends to have a higher etching rate than other wafer portions. So with a gas baffle plate having a same diameter along all directions of the plate surface, the BCD performance of a point on the wafer 510 tends to become higher as the point moves closer to the RF inlet portion 550.

In this example, a wafer portion 530 corresponds to the gas outlet. That is, the wafer portion 530 is closer to the gas outlet than any other portion of the wafer 510, and is referred to as the gas outlet portion 530. In this example, the gas outlet portion 530 is located at the top portion, to the X direction, of the wafer 510. As such, process gas received from the gas inlet can reach the gas outlet portion 530 following either a shorter path along the right side of the gas inlet portion 540 or a longer path along the left side of the gas inlet portion 540. As shown in FIG. 5, with a gas baffle plate having a same diameter along all directions of the plate surface, the etching rate tends to be lower at the right side of the wafer 510 compared to the etching rate at the left side of the wafer 510.

Figure 6:
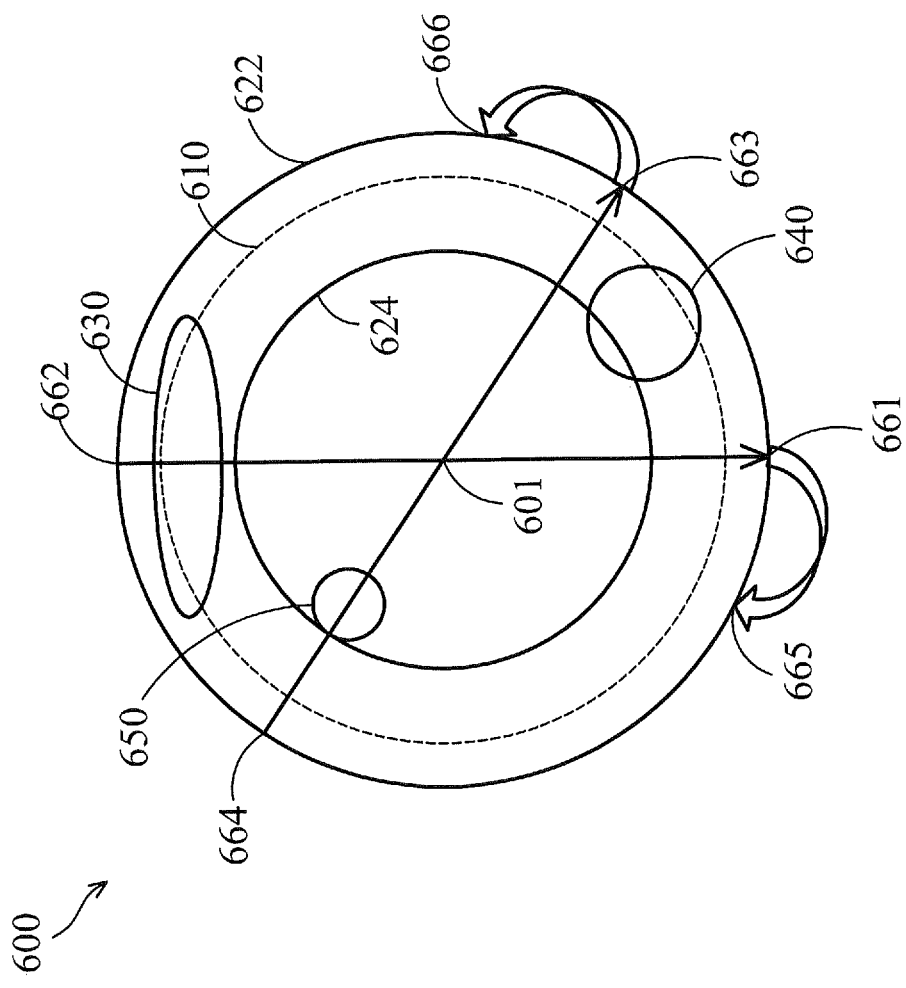
FIG. 6 illustrates a top view of an exemplary baffle plate with marked positions for a gas inlet, a gas outlet, and a radio frequency (RF) inlet, in accordance with some embodiments of the present disclosure.

FIG. 6 illustrates a top view of an exemplary baffle plate 600 with marked positions for a gas inlet, a gas outlet, and a radio frequency (RF) inlet, in accordance with some embodiments of the present disclosure. In one embodiment, the baffle plate 600 may be implemented as the gas baffle plate 270 in FIG. 2. As shown in FIG. 6, the gas baffle plate 600 in this example has an annular shape bordered by an outer circle 622 and an inner circle 624. Based on the top view of the gas baffle plate 600, FIG. 6 shows a corresponding projection of the wafer 610 placed under the gas baffle plate 600.

In one embodiment, the wafer 610 and the gas baffle plate 600 are the same as or correspond to the wafer 510 and the gas baffle plate on the wafer 510, respectively. In addition, FIG. 6 also shows gas baffle portions of the gas baffle plate 600 corresponding to the gas inlet, the gas outlet, and the RF inlet.

In this example, a gas baffle portion 640 corresponds to the gas inlet. That is, the gas baffle portion 640 is closer to the gas inlet than any other portion of the gas baffle plate 600, and is referred to as the gas inlet portion 640. In this example, the gas inlet portion 640 is located at the right lower corner, to a direction between Y and −X, of the gas baffle plate 600. As discussed before, due to a higher process gas density under the gas inlet portion 640, a wafer portion under the gas inlet portion 640 tends to have a lower etching rate than other wafer portions.

In this example, a gas baffle portion 650 corresponds to the RF inlet. That is, the gas baffle portion 650 is closer to the RF inlet than any other portion of the gas baffle plate 600, and is referred to as the RF inlet portion 650. In this example, the RF inlet portion 650 is located at the left upper portion, to a direction between X and −Y, of the gas baffle plate 600. As discussed before, due to a stronger magnetic field and a higher plasma density under the gas baffle plate 600, a wafer portion under the RF inlet portion 650 tends to have a higher etching rate than other wafer portions.

In this example, a gas baffle portion 630 corresponds to the gas outlet. That is, the gas baffle portion 630 is closer to the gas outlet than any other portion of the gas baffle plate 600, and is referred to as the gas outlet portion 630. In this example, the gas outlet portion 630 is located at the top portion, to the X direction, of the gas baffle plate 600. As such, process gas received from the gas inlet can reach the gas outlet portion 630 following either a shorter path 664 along the right side of the gas inlet portion 640 or a longer path 662 along the left side of the gas inlet portion 640.

As shown in FIG. 6, the baffle plate 600 includes a point 661 that is farthest away from the gas outlet portion 630 among all points on the baffle plate 600; and a point 663 that is farthest away from the RF inlet portion 650 among all points on the baffle plate 600. The baffle plate 600 also includes a point 662 that is centrosymmetric to the point 661 around a center point 601 of the baffle plate 600; and a point 664 that is centrosymmetric to the point 663 around the center point 601 of the baffle plate 600. According to the CD performance in FIG. 5, CD performance tends to be lower between the point 661 and the point 663 than other portions. As such, a special structure (e.g. a larger inner radius) may be designed for a first portion between the point 661 and the point 663, to make the plasma flow move to the first portion from a second portion between the point 662 and the point 664. In one embodiment, the special structure may be designed for an extended portion between the point 665 and the point 666. The extended portion may be achieved by extending 0~60 degrees from the first portion. In one embodiment, the point 665 is to the left (along the −Y direction) from the point 661 by a degree that is in a range from zero to about 30 degrees; and the point 666 is to the right (along the Y direction) from the point 663 by a degree that is in a range from zero to about 30 degrees.

Figure 7:
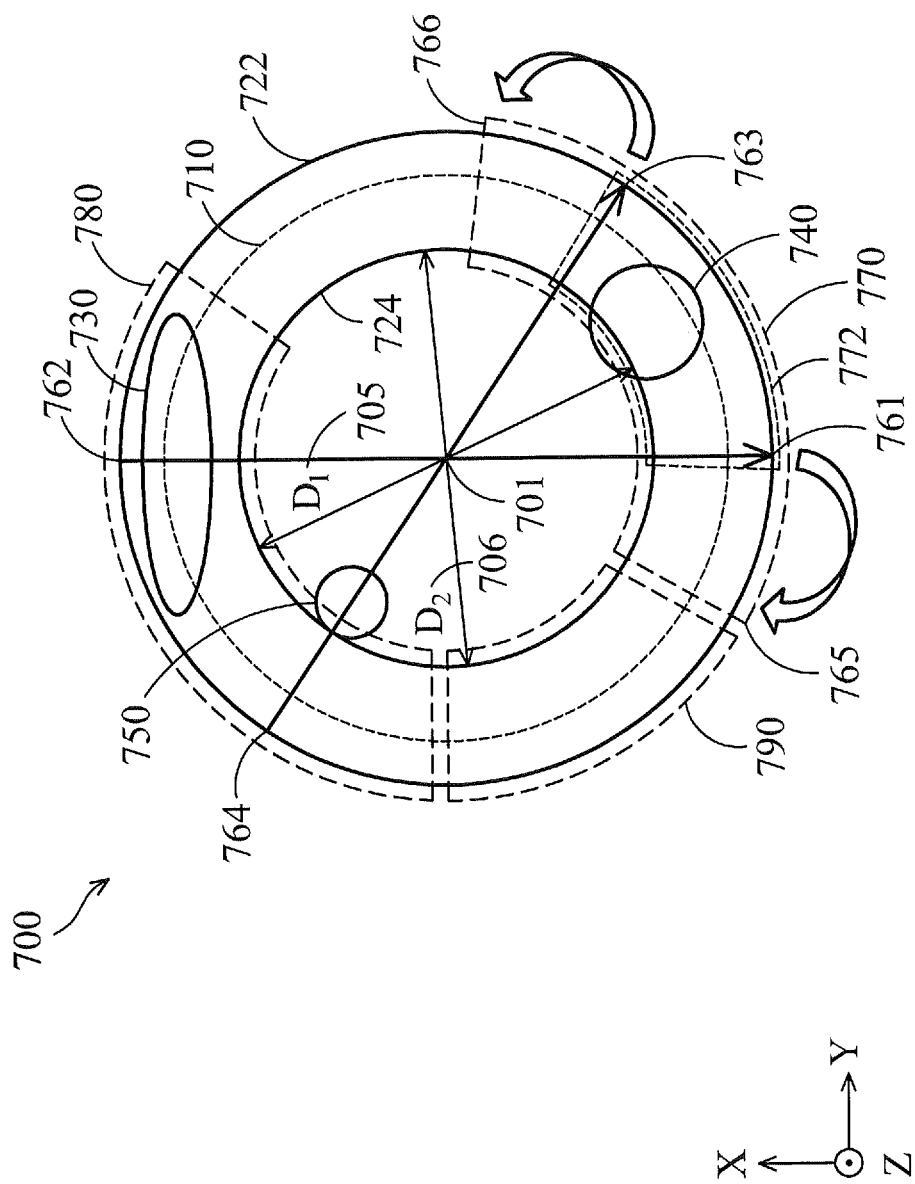
FIG. 7 illustrates a top view of an exemplary baffle plate including multiple zones, in accordance with some embodiments of the present disclosure.

FIG. 7 illustrates a top view of an exemplary baffle plate 700 including multiple zones, in accordance with some embodiments of the present disclosure. In one embodiment, the baffle plate 700 may be implemented as the baffle plate 270 in FIG. 2. As shown in FIG. 7, the baffle plate 700 in this example has an annular shape bordered by an outer circle 722 and an inner circle 724. Based on the top view of the gas baffle plate 700, FIG. 7 shows a corresponding projection of the wafer 710 placed under the gas baffle plate 700. Similar to FIG. 6, FIG. 7 shows baffle plate portions of the baffle plate 700 corresponding to the gas inlet, the gas outlet, and the RF inlet, including: a baffle plate portion 740 corresponding to the gas inlet that is closer to the gas inlet than any other portion of the baffle plate 700, and is located at the right lower corner, to a direction between Y and −X, of the baffle plate 700, and is referred to as the gas inlet portion 740; a baffle plate portion 750 corresponding to the RF inlet that is closer to the RF inlet than any other portion of the baffle plate 700 and is located at the left upper portion, to a direction between X and −Y, of the baffle plate 700, and is referred to as the RF inlet portion 750; and a baffle plate portion 730 corresponding to the gas outlet that is closer to the gas outlet than any other portion of the baffle plate 700 and is located at the top portion, to the X direction, of the baffle plate 700, and is referred to as the gas outlet portion 730.

As shown in FIG. 7, the baffle plate 700 includes a point 761 that is farthest away from the gas outlet portion 730 among all points on the baffle plate 700; and a point 763 that is farthest away from the RF inlet portion 750 among all points on the baffle plate 700. The baffle plate 700 also includes a point 762 that is centrosymmetric to the point 761 around a center point 701 of the baffle plate 700; and a point 764 that is centrosymmetric to the point 763 around the center point 701 of the baffle plate 700. In this embodiment, the baffle plate 700 is divided into a plurality of zones: a first zone 770 including a first annulus sector, a second zone 780 including a second annulus sector, and a third zone 790 including a third annulus sector. The first annulus sector 770 comprises a point 763 that is farthest away from the RF inlet among all points on the baffle plate 700, and a point 761 that is farthest away from the gas outlet among all points on the baffle plate 700. The second annulus sector 780 comprises a point 764 that is centrosymmetric to the point 763 around the center point 701 of the baffle plate 700, and a point 762 that is centrosymmetric to the point 761 around the center point 701 of the baffle plate 700.

In the example shown in FIG. 7, the first annulus sector 770 comprises a fourth annulus sector 772 that is bordered by two straight edges and two arcs. A first edge of the two straight edges comprises the point 763 that is farthest away from the RF inlet among all points on the baffle plate 700. A second edge of the two straight edges comprises the point 761 that is farthest away from the gas outlet among all points on the baffle plate 700. The first annulus sector 770 is also bordered by two straight edges and two arcs, where a first edge of the two straight edges comprises the point 765 to the left (along the −Y direction) of the point 761, and a second edge of the two straight edges comprises the point 766 to the right (along the Y direction) of the point 763. In one embodiment, a central angle of the first annulus sector 770 is larger than a central angle of the fourth annulus sector 772 by a degree that is in a range from zero to about 60 degrees. In one embodiment, the point 765 is to the left (along the −Y direction) from the point 761 by a degree that is in a range from zero to about 30 degrees; and the point 766 is to the right (along the Y direction) from the point 763 by a degree that is in a range from zero to about 30 degrees. In one embodiment, the fourth annulus sector 772 is located at a center of the first annulus sector 770. In another embodiment, the fourth annulus sector 772 comprises the gas inlet portion 740 or a point that is closest to the gas inlet among all points on the baffle plate 700.

According to the CD performance in FIG. 5, CD performance tends to be lower in the first annulus sector 770, and especially in the fourth annulus sector 772. As such, a special structure (e.g. a longer inner radius or diameter) may be designed for the first annulus sector 770, to make the plasma flow move to from the second annulus sector 780 to the first annulus sector 770. The baffle plate 700 has a diameter D1 705 connecting the first annulus sector 770 and the second annulus sector 780; and a diameter D2 706 cross the third annulus sector 790 and the center point 701. In one embodiment, the diameter D1 705 is longer than the diameter D2 706, e.g. by about a percentage that is in a range from about 1% to about 16%. In one embodiment, the diameter D1 705 is along a first direction from the center point 701 to a point between the point 761 and the point 763, or from the center point 701 to a point that has a minimum average distance from the point 761 and the point 763 among all points on the baffle plate 700. The diameter D1 705 along the first direction is longer than a diameter along a second direction that is orthogonal to the first direction. This can compensate for the wafer non-uniformity induced by at least one of positions of the gas inlet, the gas outlet and the RF inlet relative to the baffle plate 700.

Figure 8:
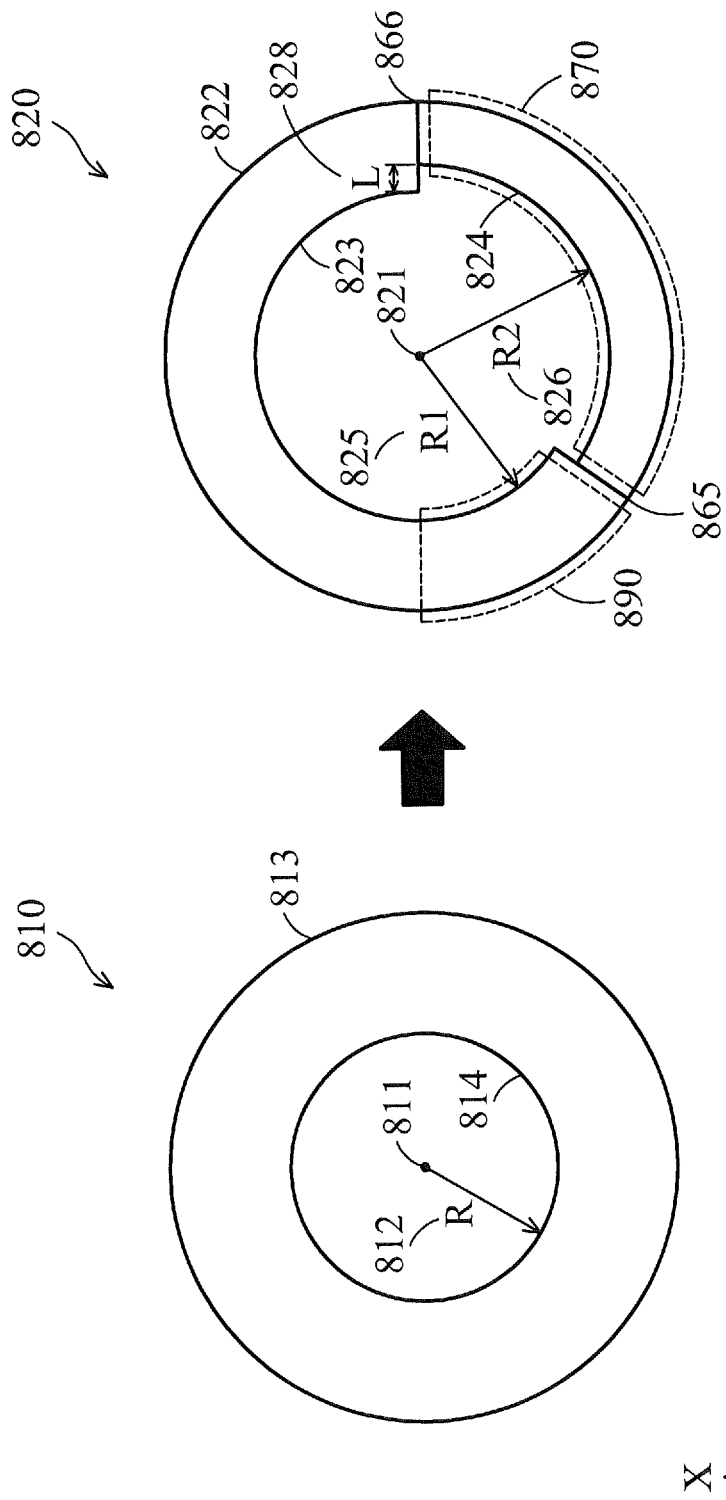
FIG. 8 illustrates an exemplary method of making a baffle plate including multiple zones, in accordance with some embodiments of the present disclosure.

FIG. 8 illustrates an exemplary method of making a baffle plate 820 including multiple zones, in accordance with some embodiments of the present disclosure. FIG. 8 shows a baffle plate 810 having a uniform inner radius R 812, and a baffle plate 820 having two inner radii R1 825 and R2 826. The baffle plate 810 in this example has an annular shape bordered by an outer circle 813 and an inner circle 814. The inner radius R 812 connecting a center point 811 of the baffle plate 810 to the inner circle 814 is the same along all directions on the plate surface of the baffle plate 810.

The baffle plate 820 in this example has an annular shape bordered by an outer circle 822 and two inner arcs 823, 824. The inner radius R1 825 connects a center point 821 of the baffle plate 820 to the inner arc 823; and the inner radius R2 826 connects the center point 821 of the baffle plate 820 to the inner arc 824. As shown in FIG. 8, the baffle plate 820 includes a first annulus sector 870 having the inner radius R2 826 and a second annulus sector 890 having the inner radius R1 825. The first annulus sector 870 and the second annulus sector 890 share the same 822 and have a same outer radius. The first annulus sector 870 is bordered by the inner arc 824, the outer circle 822, and two straight edges that comprise points 865, 866 respectively. In one embodiment, the point 865 is at a 7 o'clock direction from the center point 821; and the point 866 is at a 3 o'clock direction from the center point 821. The second annulus sector 890 is to the left (along the −Y direction) of the first annulus sector 870. In some embodiments, the inner curvature of the first annulus sector 870 is the same as the outer curvature of the first annulus sector 870. In other embodiments, the inner curvature of the first annulus sector 870 is different from the outer curvature of the first annulus sector 870.

In one embodiment, the baffle plate 820 may be implemented as the baffle plate 270 in FIG. 2. In one embodiment, the baffle plate 810 and the baffle plate 820 may be arranged in a process chamber with the positions of the gas inlet, the gas outlet, and the RF inlet same as those marked in FIGS. 5-7. Accordingly, the first annulus sector 870 includes a first point that is farthest away from the gas outlet among all points on the baffle plate 820; and a second point that is farthest away from the RF inlet among all points on the baffle plate 820.

In one embodiment, the inner radius R1 825 is designed to be larger than the uniform inner radius R 812 of the baffle plate 810 to improve wafer uniformity by extending the plasma flow towards outer side of the wafer. For example, while the uniform inner radius R 812 is equal to about 85 mm based on a wafer type to be processed, the inner radius R1 825 is increased to about 95 mm for the same wafer type.

In addition, the inner radius R2 826 is longer than the inner radius R1 825 by a length L 828, to compensate for the wafer non-uniformity induced by at least one of positions of the gas inlet, the gas outlet and the RF inlet relative to the baffle plate 820. The length L 828 may be in a range from about 1 mm to about 15 mm, based on an inner radius (R1 and R2) of about 100 mm, to compensate for the wafer non-uniformity. In one embodiment, the inner radius R2 826 is longer than the inner radius R1 825 by a percentage that is in a range from about 1% to about 16%, which is not too small to differentiate R1 and R2 and not too large to over-compensate. For example, while the inner radius R1 825 is equal to about 95 mm, the inner radius R2 826 is equal to about 103 mm, longer than the inner radius R1 825 by about 8 mm. Having a larger inner radius, the first annulus sector 870 attracts more plasma flow from the opposite side of the baffle plate 820, which further improves the wafer uniformity.

Figure 9:
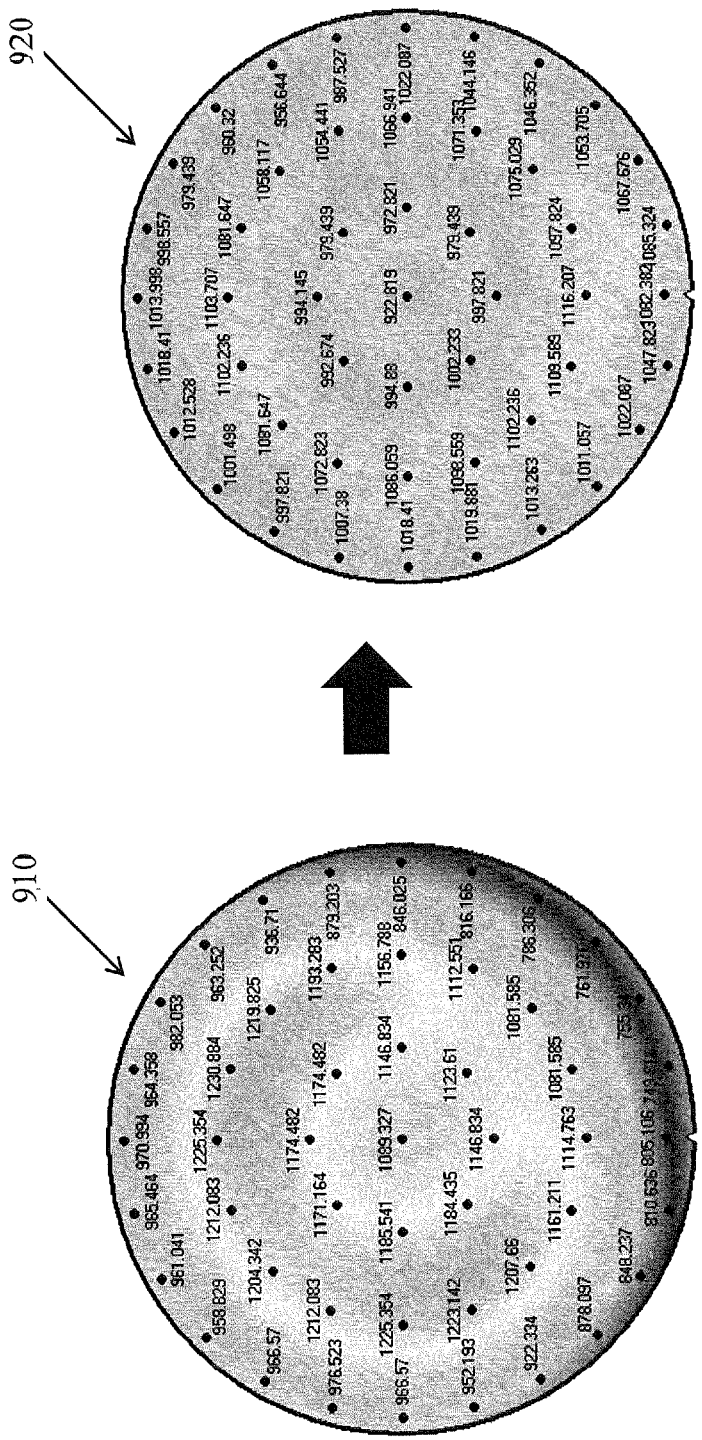
FIG. 9 illustrates exemplary CD maps of a wafer before and after using a disclosed baffle plate, in accordance with some embodiments of the present disclosure.

FIG. 9 illustrates exemplary CD maps of a wafer before and after using a disclosed baffle plate, e.g. the baffle plate disclosed in any of FIGS. 1-8, in accordance with some embodiments of the present disclosure. As shown in FIG. 9, the CD performance of a wafer processed using a disclosed baffle plate can achieve a higher uniformity than that of a wafer processed without using the disclosed baffle plate. In one example, a TSV BCD distribution on the wafer before using the disclosed baffle plate has a mean of about 1034, a 3-sigma value of about 465, and a uniformity of 23.3%; while a TSV BCD distribution on the wafer after using the disclosed baffle plate has a same mean of about 1034, a smaller 3-sigma value of about 206, and an improved uniformity of 12.6%. The grey scale shown in FIG. 9 reflects critical dimensions.

FIG. 10 is a flow chart illustrating an exemplary method 1000 for designing a gas baffle plate to control wafer uniformity in plasma-based processes, in accordance with some embodiments of the present disclosure. At operation 1002, a first position of a gas outlet of a process chamber is determined. The gas outlet is configured to expel a processed gas from the process chamber. At operation 1004, a second position of an RF inlet configured to receive RF energy for generating plasma in the process chamber is determined. At operation 1006, the baffle plate is refined based on at least one of the first position and the second position. The baffle plate has an annular shape that comprises a first annulus sector having a first inner radius and a second annulus sector having a second inner radius that is different from the first inner radius. The order of the operations shown in FIG. 10 may be changed according to different embodiments of the present disclosure.

In an embodiment, a device for plasma-based processes is disclosed. The device includes: a housing defining a process chamber and a baffle plate arranged above a wafer in the process chamber. The baffle plate is configured to control plasma distribution on the wafer. The baffle plate has a shape of an annulus that comprises a first annulus sector and a second annulus sector. The first annulus sector has a first inner radius. The second annulus sector has a second inner radius that is different from the first inner radius.

In another embodiment, a process chamber is disclosed. The process chamber includes: a gas inlet configured to receive a process gas; a gas outlet configured to expel a processed gas; a radio frequency (RF) inlet configured to receive RF energy for exciting the process gas to generate plasma in the process chamber; and a baffle plate located in the process chamber and configured to control plasma distribution in the process chamber. The baffle plate has a hole with a diameter that varies along different directions based on at least one of positions of the gas inlet, the gas outlet and the RF inlet.

In yet another embodiment, a method for designing a baffle plate is disclosed. The method includes: determining a first position of a gas outlet of a process chamber, wherein the gas outlet is configured to expel a processed gas from the process chamber; determining a second position of a radio frequency (RF) inlet for the process chamber, wherein the RF inlet is configured to receive RF energy for generating plasma in the process chamber; and refining the baffle plate based on at least one of the first position and the second position. The baffle plate is to be arranged above a wafer in the process chamber and configured to control plasma distribution on the wafer. The baffle plate has a shape of an annulus that comprises a first annulus sector having a first inner radius and a second annulus sector having a second inner radius. The first inner radius is different from the second inner radius based on the refining.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for plasma-based processes, comprising:
a housing defining a process chamber;
a baffle plate arranged above a wafer in the process chamber and configured to control plasma distribution on the wafer; and
a radio frequency (RF) inlet configured to receive RF energy for generating plasma for processing the wafer, wherein:
  a top flat surface of the baffle plate has an annulus shape,
  the annulus shape of the baffle plate consists of: a first annulus sector and a second annulus sector that are both on the top flat surface,
  the first annulus sector has a first inner radius,
  the first annulus sector comprises a first point that is farthest away from the RF inlet among all points on the top flat surface of the baffle plate, and
  the second annulus sector has a second inner radius that is smaller than the first inner radius.

2. The device of claim 1, further comprising:
a gas inlet configured to receive a process gas; and
a gas outlet configured to expel a processed gas.

3. The device of claim 2, wherein:
the first annulus sector comprises a third point that is farthest away from the gas outlet among all points on the top flat surface of the baffle plate; and
the second annulus sector comprises a fourth point that is centrosymmetric to the third point around a center point of the baffle plate.

4. The device of claim 3, wherein:
the first annulus sector comprises a third annulus sector that is bordered by two straight edges and two arcs;
a first edge of the two straight edges comprises the first point; and
a second edge of the two straight edges comprises the third point.

5. The device of claim 4, wherein:
a central angle of the first annulus sector is larger than a central angle of the third annulus sector by a degree that is in a range from zero to about 60 degrees.

6. The device of claim 4, wherein the third annulus sector is located at a center of the first annulus sector.

7. The device of claim 4, wherein the third annulus sector comprises a fifth point that is closest to the gas inlet among all points on the top flat surface of the baffle plate.

8. The device of claim 1, wherein:
the second inner radius is about 95 mm; and
the first inner radius is longer than the second inner radius by a length that is in a range from about 1 mm to about 15 mm.

9. The device of claim 1, wherein:
the second annulus sector comprises a second point that is centrosymmetric to the first point around a center point of the baffle plate.

10. The device of claim 1, wherein:
the first inner radius is longer than the second inner radius by a percentage that is in a range from about 1% to about 16%.

11. The device of claim 1, wherein the annulus is formed by the first annulus sector and the second annulus sector.

12. The device of claim 1, wherein the first annulus sector and the second annulus sector have a same outer radius.

13. A process chamber, comprising:
a gas inlet configured to receive a process gas;
a gas outlet configured to expel a processed gas;
a radio frequency (RF) inlet configured to receive RF energy for exciting the process gas to generate plasma in the process chamber; and
a baffle plate located in the process chamber and configured to control plasma distribution in the process chamber, wherein
a top flat surface of the baffle plate has a central hole with a diameter that varies along different directions on the top flat surface based on at least one of: a first position of the gas inlet, a second position of the gas outlet, or a third position of the RF inlet, and
an outer edge of the baffle plate on the top flat surface has a circular shape whose center point is within and part of the central hole.

14. The process chamber of claim 13, wherein:
the baffle plate comprises:
a first point that is farthest away from the RF inlet among all points on the top flat surface of the baffle plate,
a second point that is farthest away from the gas outlet among all points on the top flat surface of the baffle plate, and
a third point that has a minimum average distance from the first point and the second point among all points on the baffle plate; and the diameter is longer along a first direction crossing the third point than that along a second direction that is orthogonal to the first direction.

15. The process chamber of claim 14, wherein the diameter is longer along the first direction than that along the second direction by at least one of:
a length that is in a range from about 1 mm to about 15 mm; or
a percentage that is in a range from about 1% to about 16%.

16. A device for plasma-based processes, comprising:
a housing defining a process chamber;
a baffle plate arranged above a wafer in the process chamber and configured to control plasma distribution on the wafer;
a gas inlet configured to receive a process gas; and
a gas outlet configured to expel a processed gas, wherein:
a top flat surface of the baffle plate has an annulus shape,
the annulus shape of the baffle plate consists of: a first annulus sector and a second annulus sector that are both on the top flat surface,
the first annulus sector has a first inner radius,
the first annulus sector comprises a first point that is farthest away from the gas outlet among all points on the top flat surface of the baffle plate, and
the second annulus sector has a second inner radius that is smaller than the first inner radius.

17. The device of claim 16, wherein:
the second annulus sector comprises a second point that is centrosymmetric to the first point around a center point of the baffle plate.

18. The device of claim 16, wherein:
the second inner radius is about 95 mm; and
the first inner radius is longer than the second inner radius by a length that is in a range from about 1 mm to about 15 mm.

19. The device of claim 16, wherein:
the first inner radius is longer than the second inner radius by a percentage that is in a range from about 1% to about 16%.

20. The device of claim 16, wherein:
the annulus is formed by the first annulus sector and the second annulus sector; and
the first annulus sector and the second annulus sector have a same outer radius.

* * * * *